(12) United States Patent
Korherr et al.

(10) Patent No.: US 11,467,696 B2
(45) Date of Patent: Oct. 11, 2022

(54) CAPACITIVE MOTOR VEHICLE OPERATING SYSTEM

(71) Applicant: BCS AUTOMOTIVE INTERFACE SOLUTIONS GMBH, Radolfzell (DE)

(72) Inventors: Joachim Korherr, Radolfzell (DE); Annkathrin Oksche, Radolfzell (DE); Timo Schubert, Radolfzell (DE); Soeren Lemcke, Radolfzell (DE)

(73) Assignee: BCS AUTOMOTIVE INTERFACE SOLUTIONS GMBH, Radolfzell (DE)

( * ) Notice: Subject to any disclaimer, the term of this patent is extended or adjusted under 35 U.S.C. 154(b) by 0 days.

(21) Appl. No.: 16/507,233

(22) Filed: Jul. 10, 2019

(65) Prior Publication Data
US 2020/0019263 A1 Jan. 16, 2020

(30) Foreign Application Priority Data
Jul. 11, 2018 (DE) .......................... 102018116833.0

(51) Int. Cl.
| G06F 3/044 | (2006.01) |
| G06F 3/0362 | (2013.01) |
| B60R 11/02 | (2006.01) |
| G01D 5/14 | (2006.01) |
| G01D 5/22 | (2006.01) |

(Continued)

(52) U.S. Cl.
CPC .......... *G06F 3/044* (2013.01); *B60R 11/0235* (2013.01); *B60R 11/0264* (2013.01); *G01D 5/142* (2013.01); *G01D 5/22* (2013.01); *G01D 5/3473* (2013.01); *G06F 3/0362* (2013.01); *G06F 3/0488* (2013.01)

(58) Field of Classification Search
CPC .. B60K 35/00; B60K 37/06; B60K 2370/126; B60K 2370/1438; B60K 2370/145; B60R 11/0235; B60R 11/0264; G01D 5/142; G01D 5/22; G01D 5/3473; G06F 3/016; G06F 3/017; G06F 3/03; G06F 3/033; G06F 3/03547; G06F 3/0362; G06F 3/0414; G06F 3/044; G06F 3/04845; G06F 3/0485; G06F 3/0488; G06F 3/04883; H03K 17/962; H03K 2217/94057
See application file for complete search history.

(56) References Cited

U.S. PATENT DOCUMENTS

| 8,274,487 B2 | 9/2012 | Meier-Arndt et al. |
| 9,630,499 B2 | 4/2017 | Blaesing |

(Continued)

FOREIGN PATENT DOCUMENTS

| DE | 102006043208 A1 | 3/2008 |
| DE | 102013014792 A1 | 3/2015 |

(Continued)

*Primary Examiner* — Stephen G Sherman
(74) *Attorney, Agent, or Firm* — McNees Wallace & Nurick LLC

(57) ABSTRACT

A capacitive motor vehicle operating system is described, comprising a capacitive screen with an operator interface as well as a pressure- and rotational-actuation device which is formed separately from the capacitive screen, and which is electrically conductive in areas and is at least partially affixed to the operator interface of the capacitive screen. The pressure- and rotational-actuation device comprises at least one electrically conductive interaction element which interacts with the capacitive screen.

14 Claims, 9 Drawing Sheets

(51) Int. Cl.
*G01D 5/347* (2006.01)
*G06F 3/0488* (2022.01)

(56) References Cited

U.S. PATENT DOCUMENTS

| | | | |
|---|---|---|---|
| 9,958,959 B2 | 5/2018 | Dietz et al. | |
| 10,754,451 B2 | 8/2020 | Fischer et al. | |
| 10,908,630 B2 | 2/2021 | Schmidt et al. | |
| 11,029,719 B2 | 6/2021 | Klein et al. | |
| 11,040,621 B2 | 6/2021 | Eckert | |
| 2008/0238879 A1* | 10/2008 | Jaeger | G06F 3/0383 345/173 |
| 2009/0237370 A1 | 9/2009 | Meier-Arendt et al. | |
| 2015/0234418 A1* | 8/2015 | Bouaziz | G05G 1/015 74/527 |
| 2016/0176292 A1 | 6/2016 | Blaesing et al. | |
| 2016/0364014 A1 | 12/2016 | Dietz et al. | |
| 2018/0074639 A1* | 3/2018 | Powell | G06F 3/04847 |
| 2018/0154774 A1* | 6/2018 | Park | G02B 27/0101 |
| 2018/0253119 A1 | 9/2018 | Schmidt et al. | |
| 2018/0314357 A1 | 11/2018 | Klein et al. | |
| 2019/0146594 A1* | 5/2019 | Nakagawa | G06F 3/041 345/174 |
| 2019/0391672 A1 | 12/2019 | Fischer et al. | |
| 2020/0301547 A1* | 9/2020 | Mori | G06F 3/0362 |
| 2021/0001725 A1 | 1/2021 | Eckert | |

FOREIGN PATENT DOCUMENTS

| | | | |
|---|---|---|---|
| DE | 102015002300 A1 | 8/2016 | |
| DE | 102015210657 A1 | 12/2016 | |
| DE | 102015117226 A1 | 3/2017 | |
| DE | 102015118587 A1 | 5/2017 | |
| DE | 102016120638 A1 | 5/2018 | |
| EP | 3112996 A1 | 1/2017 | |
| EP | 3220402 A1 | 9/2017 | |
| EP | 3822753 A1 | 5/2021 | |
| FR | 3035981 A1 | 11/2016 | |
| FR | 3056474 A1 | 3/2018 | |
| FR | 3056475 * | 3/2018 | |
| FR | 3056475 A1 | 3/2018 | |
| FR | 3058938 A1 | 5/2018 | |
| WO | 2014093830 A1 | 6/2014 | |
| WO | WO-2019116490 A1 * | 6/2019 | G06F 3/0393 |

* cited by examiner

CAPACITIVE MOTOR VEHICLE OPERATING SYSTEM

TECHNICAL FIELD

Embodiments of the present disclosure relate to a capacitive motor vehicle operating system for the interior of a motor vehicle.

BACKGROUND

From the state of the art motor vehicle operating systems are known, with which functions of a motor vehicle can be switched on or off, for example a multimedia system of a motor vehicle. The motor vehicle operating systems usually comprise control elements formed by mechanical switches and the like, which can be pressed or rotated by a vehicle occupant in order to activate or deactivate an assigned function.

In addition, in the case of modern motor vehicles, capacitive motor vehicle operating systems with correspondingly capacitive control elements are known, which detect an approach or a touch, whereupon the motor vehicle operating system carries out an assigned function. However, the capacitive motor vehicle operating systems known from the state of the art are relatively complex in construction, as a result of which the manufacturing costs are correspondingly high.

In addition, capacitive screens for controlling vehicle functions are known, on which corresponding circuit symbols or buttons are displayed, which a vehicle occupant can touch or approach in order to carry out an assigned function. In addition to usual buttons, so-called sliding areas are also known, along which the operator of the motor vehicle operating system can, for example, slide his finger in order to adjust a function smoothly or stepwise. The corresponding function can be a volume control of a multimedia system, in the case of which the operator of the motor vehicle operating system moves his finger along an area represented on the capacitive operator interface of the capacitive screen in order to set the desired volume.

It has turned out to be a disadvantage of capacitive screens that the surface areas required for the operation on the capacitive screen are correspondingly large, whereby only a few functions can be displayed on the capacitive screen simultaneously.

SUMMARY

The object is to provide a motor vehicle operating system that is simply constructed and easy to operate.

The object is achieved according to the present disclosure by a capacitive motor vehicle operating system comprising a capacitive screen with an operator interface as well as a pressure- and rotational-actuation device which is formed separately from the capacitive screen, and which is electrically conductive in areas and is thus at least partially affixed to the operator interface of the capacitive screen, wherein the pressure- and rotational-actuation device comprises at least one electrically conductive interaction element which interacts with the capacitive screen.

The basic idea is that an electrical connection is produced between the operator of the motor vehicle operating system and the capacitive screen, in particular the operator interface, when the operator touches or approaches the pressure- and rotational-actuation device that is electrically conductive at least in areas, whereby an electrical connection is produced between the operator and the capacitive screen via the pressure- and rotational-actuation device formed separately for this purpose.

As the pressure- and rotational-actuation device is at least partially affixed to the operator interface of the capacitive screen, it is not possible for the entire pressure- and rotational-actuation device to be moved over the capacitive screen, in particular its operator interface, in order to carry out a corresponding function on the screen. Rather, according to the present disclosure it is provided that there is a fixed assignment between the pressure- and rotational-actuation device and the capacitive screen arranged underneath it, whereby corresponding functions can be activated or deactivated in a space-saving manner. In other words the pressure- and rotational-actuation device is arranged stationary on the capacitive screen, as it always occupies the same surface area on the capacitive screen, independently of the action.

For example, it is possible to control the volume via the rotational actuation of the pressure- and rotational-actuation device, or thus to scroll through an address book.

The pressure- and rotational-actuation device can be glued to the capacitive screen in a simple manner, whereby it is correspondingly affixed stationary to the capacitive screen.

The capacitive screen is set up in the usual manner, with the result that it detects the position and/or the movement of the at least one electrically conductive interaction element of the pressure- and rotational-actuation device in relation to the capacitive screen provided that there is a contact with the capacitive screen, and outputs corresponding signals which are converted into corresponding functions, for example by a superordinate control and/or computing unit.

Generally, for the pressure actuation and the rotational actuation of the pressure- and rotational-actuation device, separately formed interaction elements can be provided, thus at least one pressure-actuation interaction element as well as at least one rotational-actuation interaction element.

In particular the pressure- and rotational-actuation device provides a haptic feedback during actuation.

Moreover, the entire pressure- and rotational-actuation device can be laterally immobile in a plane spanned by the screen.

The pressure- and rotational-actuation device can have a stationary base, in particular in relation to the capacitive screen. The pressure- and rotational-actuation device is, for example, affixed to the capacitive screen via the stationary base, in particular in such a way that the entire pressure- and rotational-actuation device is laterally immobile in a plane spanned by the screen.

In order to ensure the rotational actuation of the pressure- and rotational-actuation device, the pressure- and rotational-actuation device can have an actuation element, in particular formed ring-shaped, which is displaceable. A rotation of the displaceable actuation element in relation to the base is therefore possible in order to realize the rotational actuation.

Furthermore, the pressure- and rotational-actuation device can be rotated about a rotational axis which is substantially perpendicular to the surface of the capacitive screen.

The pressure actuation is therefore effected substantially parallel to the rotational axis, thus in the direction of the capacitive screen.

One aspect provides that, during actuation of the pressure- and rotational-actuation device, there is an electrical connection between the operator interface of the capacitive screen and a rotatable actuation element of the pressure- and rotational-actuation device. Via the electrical connection the capacitive screen recognizes that the pressure- and rotational-actuation device is being operated by the operator of the motor vehicle operating system. The electrical connection produced can be regarded as a trigger signal or release signal for the motor vehicle operating system. The electrical connection is provided via the at least one electrically conductive interaction element which contacts the operator interface during actuation.

Provided that the operator performs a rotational actuation of the pressure- and rotational-actuation device, the electrically conductive interaction element can be moved via the operator interface, wherein the capacitive screen correspondingly recognizes the movement.

The capacitive screen can further be set up to detect the surface area, thus the size of the surface area, and/or different positions on the operator interface, which is or are contacted by the interaction element during an actuation of the pressure- and rotational-actuation device, in order thereby to infer a corresponding operation of the pressure- and rotational-actuation device.

For example, a pressure actuation of the pressure- and rotational-actuation device leads to there being a large surface contact between the interaction element and the operator interface, which is recognized by the capacitive screen as pressure actuation, with the result that a function linked with the pressure actuation is carried out.

According to an embodiment, several interaction elements are provided, via which the rotational angle of the pressure- and rotational-actuation device can be detected. Alternatively or in addition, the at least one interaction element comprises several sections which can be actuated separately from each other and via which the rotational angle of the pressure- and rotational-actuation device can be detected, in particular wherein the several sections each comprise a haptic feedback structure. The several interaction elements are arranged distributed over the surface area assigned to the pressure- and rotational-actuation device on the capacitive screen. Depending on the actuation of the pressure- and rotational-actuation device, a different contact thus results on the capacitive screen due to the several interaction elements. For example, only one of the several interaction elements contacts the capacitive screen, with the result that the rotational actuation, in particular the rotational angle, can be inferred via the position of the corresponding interaction element on the capacitive screen. The time sequence of the respective contactings of the capacitive screen by the several interaction elements can be taken into consideration here.

Alternatively or in addition, electrically conductive sections of an interaction element (formed in one piece) can be provided, for example of a metal sheet with corresponding segments or sections, which are displaced depending on the actuation of the pressure- and rotational-actuation device relative to the capacitive screen, in order to contact the latter. An electrical connection to the capacitive screen is hereby produced, which is correspondingly detected by the capacitive screen.

Furthermore, the sections of the interaction element (formed in one piece) can each comprise a haptic feedback structure which provides the operator with a corresponding tactile feedback when the pressure- and rotational-actuation device is rotated.

Moreover, the pressure- and rotational-actuation device can have at least one force transmission element which cooperates with the interaction element. The force transmission element can be a rollable force transmission element, for example a ball, which can be moved relative to the operator interface during a rotational actuation of the pressure- and rotational-actuation device.

The force transmission element can be moved relative to the at least one interaction element, wherein it displaces the at least one interaction element in a direction perpendicular to the operator interface of the capacitive screen when it is moved over the at least one interaction element due to the rotational actuation of the pressure- and rotational-actuation device. In particular, the force transmission element is moved over the interaction element (formed in one piece) during a rotational actuation of the pressure- and rotational-actuation device, whereby it displaces the sections which can be correspondingly actuated individually and separately from each other, relative to the capacitive screen.

Several force transmission elements can also be provided in order to guarantee a homogeneous or even rotational actuation of the pressure- and rotational-actuation device. The several force transmission elements are preferably substantially equally spaced apart from each other.

The force transmission element can also simultaneously be the interaction element, provided that the force transmission element is electrically conductive. The force transmission element can be an electrically conductive (and optionally elastic) ball.

Generally, the force transmission element can be electrically conductive, provided that the electrical connection of the rotatable actuation element to the operator interface of the capacitive screen is formed via the force transmission element.

During actuation of the pressure- and rotational-actuation device, the at least one interaction element can experience a change in position relative to the operator interface of the capacitive screen. The actuation of the pressure- and rotational-actuation device thus ensures that the at least one interaction element is displaced relative to the operator interface of the capacitive screen, which is correspondingly detected by the capacitive screen. Provided that the at least one interaction element is moved over the capacitive screen, a relative change in position is effected via the rotational movement of the interaction element.

For example, the relative change in position is effected in a plane perpendicular to the operator interface of the capacitive screen. This is the case in particular during a pressure actuation of the pressure- and rotational-actuation device. In addition, during a rotational actuation of the pressure- and rotational-actuation device, a relative change in position of the at least one interaction element perpendicular to the operator interface can also occur. This is possible in particular when several interaction elements (which are stationary in top view and in relation to the screen) are provided, which are assigned to different regions of the capacitive screen, whereby a location- and/or time-resolved detection of the contacting of the several interaction elements is effected. The several interaction elements can be displaced independently of each other by the at least one force transmission element perpendicular to the plane spanned by the capacitive screen, when the force transmission element interacts with the corresponding interaction element.

A further aspect provides that the at least one interaction element is formed by at least one magnet. The electrical connection can correspondingly be produced in a simple manner via the magnet. Furthermore, the interaction element can then be displaced electromagnetically. For example, several magnets are provided, which interact with each other electromagnetically. The several magnets can be arranged in two planes, wherein the magnets of both planes interact with each other. During a rotational actuation of the pressure- and rotational-actuation device, one plane of the magnets can be rotated relative to the other plane of the magnets, with the result that different poles of the magnets lie opposite each other, which leads to a repulsive electromagnetic force, whereby an electrical contacting of the capacitive screen is effected.

For example, the at least one interaction element is elastic, mechanically biased and/or electromagnetically biased. It is hereby possible that the pressure- and rotational-actuation device returns to a neutral position when no more force is exerted by the operator, thus after the pressure- and rotational-actuation device has been actuated. In addition, a haptic feedback to the operator of the motor vehicle operating system can be generated via the bias. Moreover, it can be ensured via the bias that the at least one interaction element remains in the desired position. Provided that the interaction element is elastic, the interaction element thus has an inherent bias.

Furthermore, the bias can provide a security function as the capacitive screen is not damaged during actuation of the pressure- and rotational-actuation device.

It can also be provided that the at least one interaction element is formed by an electrically conductive ball which is additionally elastic, for example. During a rotational actuation of the pressure- and rotational-actuation device, the electrically conductive ball produces a corresponding electrical connection on the capacitive screen, whereby the actuation of the pressure- and rotational-actuation device is detected by the capacitive screen. Due to the elasticity it is further ensured that a tactile feedback is effected, which is also called haptic feedback.

Generally, the pressure- and rotational-actuation device can comprise at least two electrically conductive sections which serve as interaction elements and are provided at different positions in relation to the capacitive screen. The electrically conductive sections can cooperate with at least one (electrically conductive) force transmission element. During a rotational actuation of the pressure- and rotational-actuation device, the two electrically conductive sections are thus actuated at different points in time (via the at least one force transmission element), whereby the direction of movement of the pressure- and rotational-actuation device can be determined during a rotational actuation.

Moreover, the motor vehicle operating system can comprise a rotary encoder, via which the rotational angle of the pressure- and rotational-actuation device during a rotational actuation can be detected. The rotary encoder, also called encoder, can be formed in a different way.

For example, the rotary encoder comprises an optical sensor, a Hall effect sensor and/or an inductive coil. Correspondingly, the rotary encoder can also be provided in an optical and/or electromagnetic manner, besides a capacitive manner.

The at least one electrically conductive interaction element can therefore serve exclusively for the pressure actuation of the pressure- and rotational-actuation device, as the rotational actuation of the pressure- and rotational-actuation device is detected by the rotary encoder, in particular in an optical and/or electromagnetic manner.

Furthermore, the capacitive screen can have at least one display area which is assigned to the pressure- and rotational-actuation device and, during actuation of the pressure- and rotational-actuation device, outputs an optical feedback. The capacitive motor vehicle operating system is therefore simultaneously formed to provide an optical (as well as tactile) feedback, with the result that the operator of the capacitive motor vehicle operating system immediately receives a corresponding feedback.

In particular, the pressure- and rotational-actuation device is formed ring-shaped, for example wherein the pressure- and rotational-actuation device comprises a stationary base and an actuation element displaceable with respect to the base. The stationary base is affixed to the capacitive screen, in particular glued to the capacitive screen. During a rotational or pressure actuation, the displaceable actuation element is moved relative to the stationary base. During a rotational actuation, a rotation of the displaceable actuation element in relation to the base therefore results. The displaceable actuation element is in particular formed electrically conductive.

The motor vehicle operating system can be formed to detect at least one pressure actuation of the pressure- and rotational-actuation device by means of the capacitive screen in a capacitive manner. In this respect, a simply constructed motor vehicle operating system is created which detects a corresponding pressure actuation capacitively, for which the pressure- and rotational-actuation device is electrically conductive in surface areas, in order to interact with the capacitive screen. A touch of the capacitive screen by the operator is thus not necessary.

Generally, the pressure- and rotational-actuation device can comprise an electrically conductive interaction element, which is provided for the pressure actuation of the pressure- and rotational-actuation device.

Moreover, the pressure- and rotational-actuation device can comprise an electrically conductive interaction element, which is provided for the rotational actuation of the pressure- and rotational-actuation device. The electrically conductive interaction element can move over the operator interface or in a direction perpendicular to this, in particular when the electrically conductive interaction element cooperates with a force transmission element.

Alternatively or in addition, it can be provided that the rotational actuation of the pressure- and rotational-actuation device is detected via a rotary encoder, or an encoder, for example in a capacitive, optical and/or electromagnetic manner, thus due to induction and/or due to the Hall effect.

The at least one force transmission element serves in particular to transfer or to translate a rotational force into a lateral force, in that the force transmission element for example cooperates with the electrically conductive interaction element, and displaces the latter.

Generally, the capacitive screen is a display panel on which contents can be represented, in particular due to electrical gating signals. The capacitive screen is, moreover, formed touch- or approach-sensitive.

DESCRIPTION OF THE DRAWINGS

Further advantages and properties emerge from the following description and the drawings, to which reference is made. There are shown in the drawings.

DETAILED DESCRIPTION

Figure 1:
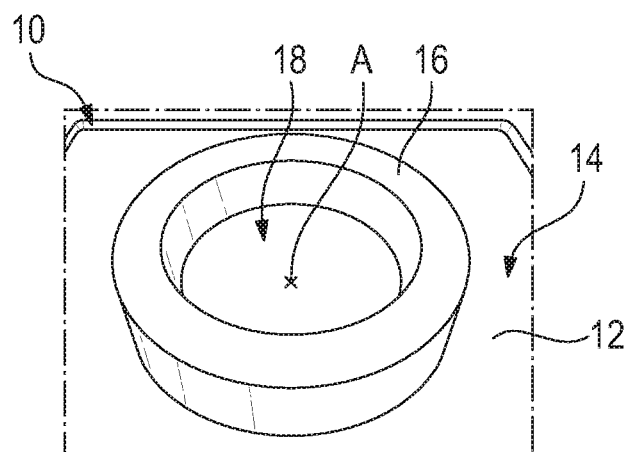
FIG. 1 a perspective view of a capacitive motor vehicle operating system according to the present disclosure, FIG. 2 a sectional view through a capacitive motor vehicle operating system according to a first embodiment, FIG. 3 a view of the underside of the pressure- and rotational-actuation device of the motor vehicle operating system according to FIG. 2, FIG. 4 an exploded view of a pressure- and rotational-actuation device of a capacitive motor vehicle operating system according to a second embodiment of the present disclosure, FIG. 5 a sectional view of the pressure- and rotational-actuation device according to FIG. 4, FIG. 6 a view of the underside of the pressure- and rotational-actuation device according to FIG. 4, FIG. 7 a perspective view of an interaction element of a pressure- and rotational-actuation device of a capacitive motor vehicle operating system according to the present disclosure, FIG. 8 an exploded view of a pressure- and rotational-actuation device of a capacitive motor vehicle operating system according to a third embodiment of the present disclosure, FIG. 9 a sectional view of the pressure- and rotational-actuation device according to FIG. 8, FIG. 10 a view from below of the pressure- and rotational-actuation device according to FIG. 8, FIG. 11 an exploded view of a pressure- and rotational-actuation device of a capacitive motor vehicle operating system according to a fourth embodiment of the present disclosure, FIG. 12 a sectional view of the pressure- and rotational-actuation device according to FIG. 11, FIG. 13 a view from below of the pressure- and rotational-actuation device according to FIG. 11, FIG. 14 an exploded view of a pressure- and rotational-actuation device of a capacitive motor vehicle operating system according to a fifth embodiment of the present disclosure, FIG. 15 a sectional view of the pressure- and rotational-actuation device according to FIG. 14, FIG. 16 a view from below of the pressure- and rotational-actuation device according to FIG. 14, FIG. 17 a sectional view of a capacitive motor vehicle operating system according to a sixth embodiment of the present disclosure, FIG. 18 a view from below of the pressure- and rotational-actuation device of the motor vehicle operating system according to FIG. 17, FIG. 19 a view of the base of the motor vehicle operating system according to FIG. 17, FIG. 20 a sectional view of a capacitive motor vehicle operating system according to a seventh embodiment of the present disclosure, FIG. 21 a detail view of FIG. 20, FIG. 22 a view from below of the pressure- and rotational-actuation device of the motor vehicle operating system according to FIG. 20, FIG. 23 a perspective representation of a part of the pressure- and rotational-actuation device of the motor vehicle operating system according to FIG. 20, FIG. 24 a sectional view of a capacitive motor vehicle operating system according to an eighth embodiment of the present disclosure, FIG. 25 a partially transparent representation of the pressure- and rotational-actuation device of the motor vehicle operating system according to FIG. 24, FIG. 26 a sectional representation of the motor vehicle operating system from FIG. 24, FIG. 27 a sectional representation of a capacitive motor vehicle operating system according to a ninth embodiment of the present disclosure, FIG. 28 a partial representation of the pressure- and rotational-actuation device of the motor vehicle operating system according to FIG. 27, and FIG. 29 a view from below of the pressure- and rotational-actuation device of the motor vehicle operating system according to FIG. 27.

FIG. 1 shows a capacitive motor vehicle operating system 10 which is used in an interior of a motor vehicle, in order to control a multimedia system and/or vehicle functions of a motor vehicle, for example.

The capacitive motor vehicle operating system 10 comprises a capacitive screen 12 which has an operator interface 14, with the result that a touch of the operator interface 14 or an approach towards the operator interface 14 can be detected capacitively.

Moreover, the capacitive motor vehicle operating system 10 comprises a pressure- and rotational-actuation device 16, which is formed separately from the capacitive screen 12.

In the embodiment shown, the pressure- and rotational-actuation device 16 is formed substantially ring-shaped, wherein the pressure- and rotational-actuation device 16 is arranged at least partially on the operator interface 14 of the capacitive screen 12. This means that the pressure- and rotational-actuation device 16 occupies a partial surface area of the operator interface 14.

The pressure- and rotational-actuation device 16 is affixed to the capacitive screen 12, in that the pressure- and rotational-actuation device 16 is for example glued to the capacitive screen 12, as explained further below.

In this respect it is ensured that the pressure- and rotational-actuation device 16 is arranged substantially stationary in relation to the capacitive screen 12. This means that the entire pressure- and rotational-actuation device 16 cannot be shifted on the capacitive screen 12, thus can be moved laterally in the plane spanned by the capacitive screen 12, which corresponds to the operator interface 14.

The pressure- and rotational-actuation device 16 is formed electrically conductive in areas, with the result that an electrical connection to the capacitive screen 12 can be produced via the pressure- and rotational-actuation device 16 when an operator of the motor vehicle operating system 10 or a vehicle occupant actuates the capacitive motor vehicle operating system 10 via the pressure- and rotational-actuation device 16, thus approaches or touches the latter.

The capacitive screen 12, which cooperates with the pressure- and rotational-actuation device 16 which is electrically conductive in areas, then recognizes the position and/or a change in position of the pressure- and rotational-actuation device 16, in particular of a part of the pressure- and rotational-actuation device 16, wherein the capacitive screen 12 generates corresponding signals in order to control an assigned function of the motor vehicle, as explained in more detail below.

For example, the capacitive screen 12 comprises at its operator interface 14 a display area 18 which is assigned to the pressure- and rotational-actuation device 16, with the result that, during actuation of the pressure- and rotational-actuation device 16, an optical feedback can be displayed on the capacitive screen 12, namely in the corresponding display area 18.

The display area 18 can be provided within the ring-shaped pressure- and rotational-actuation device 16, as shown in the embodiment example of FIG. 1. Generally, the display area 18 can also be provided at another point on the capacitive screen 12.

The pressure- and rotational-actuation device 16 is generally set up so that it can be rotated relative to the operator interface 14 of the capacitive screen 12, thus in a plane parallel to the plane spanned by the capacitive screen 12. The rotational axis A of the pressure- and rotational-actuation device 16 is fixed in relation to the capacitive screen 12.

Moreover, the pressure- and rotational-actuation device 16 can be actuated by means of a pressure actuation substantially perpendicular to the plane spanned by the capacitive screen 12, for example in the z-direction, whereas the operator interface 14 extends in the x- and y-directions.

Depending on actuation of the pressure- and rotational-actuation device 16, the operator interface 14 of the capacitive screen 12 is contacted differently by the pressure- and rotational-actuation device 16 in an electrically conductive manner, whereby a correspondingly different contact pattern, which is converted into a correspondingly assigned function, is detected and recognized by the capacitive screen 12.

Figure 2:
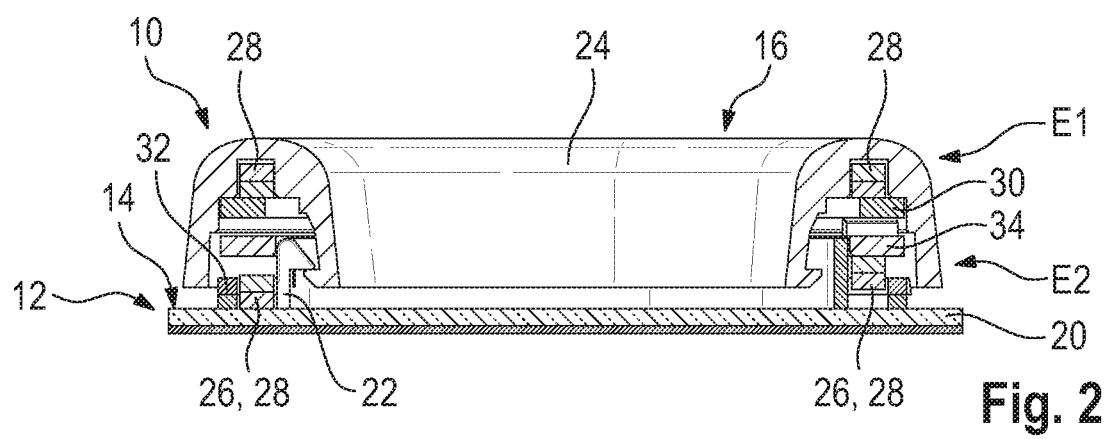
Figure 3:
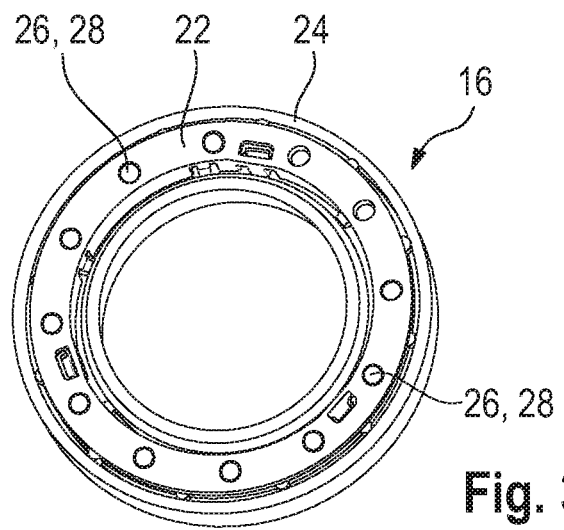

FIGS. 2 and 3 show a capacitive motor vehicle operating system 10 according to a first embodiment, wherein the pressure- and rotational-actuation device 16 is glued to a glass plate 20 of the capacitive screen 12.

It is clear from FIG. 2 that the pressure- and rotational-actuation device 16 comprises a stationary base 22, in particular a base ring, via which the pressure- and rotational-actuation device 16 is affixed to the capacitive screen 12.

Furthermore, the pressure- and rotational-actuation device 16 comprises an actuation element 24 displaceable with respect to the base 22, for example a rotating ring, via which the operator of the capacitive motor vehicle operating system 10 actuates the pressure- and rotational-actuation device 16.

In addition, the pressure- and rotational-actuation device 16 in the embodiment shown comprises several magnets 28 formed as interaction elements 26.

Generally, several magnets 28 are provided, which are arranged in two different planes E1, E2.

A first group of magnets 28, which are assigned to the first plane E1, is arranged in the rotatable actuation element 24 via a fixing ring 30, with the result that they can move with the rotatable actuation element 24, provided that the latter is actuated by the operator.

A second group of magnets 28, which are assigned to the second plane E2, are arranged in the area of the base 22, wherein these magnets 28 are the interaction elements 26, as they interact with the capacitive screen 12.

The interaction elements 26 or magnets 28 of the second group are arranged movable in an electrically conductive guide element 32 which can also be called a guide ring, as the guide element 32 is ring-shaped and electrically conductive.

The guide element 32 contacts at least the rotatable actuation element 24, with the result that an electrical connection can be formed between the electrically conductive actuation element 24 and the guide element 32.

It can also be provided that during a rotational movement of the rotatable actuation element 24 the guide element 32 is rotated with it, thus is arranged torque-proof in the actuation element 24.

In addition, it is clear from FIG. 2 that the pressure- and rotational-actuation device 16 has a stop 34, in particular a stop ring, which limits the relative movement of the interaction elements 26 or magnets 28, thus the magnets 28 of the second group, in the z-direction, as explained below when the operating principle of the motor vehicle operating system 10 according to the first embodiment is described.

In the position shown in FIG. 2, the actuation element 24 or the rotating ring has been rotated with respect to the base 22 in such a way that the two magnets 28 on the side shown on the left in the sectional representation point with their identical poles towards each other, whereby they are repelled by each other.

The magnet 28, thus the interaction element 26, assigned to the base 22 is thereby pressed (electromagnetically) onto the operator interface 14 of the capacitive screen 12, with the result that the latter contacts the operator interface 14. The actuation element 24 or the rotating ring which is touched by the operator with his fingers is electrically conductive, with the result that an electrical connection from the operator to the capacitive screen 12 is produced via the actuation element 24, the guide ring 32, the corresponding magnet 28 or the interaction element 26. This is recognized by the capacitive screen 12.

A rotation of the pressure- and rotational-actuation device 16 thus produces a relative change in position of the interaction elements 26, thus of the magnets 28 in a plane perpendicular to the plane spanned by the capacitive screen 12, namely in the z-direction, as the operator interface 14 is spanned in the x- and y-directions.

As shown on their right side in FIG. 2, the other magnets 28 point towards each other, in each case with different poles, whereby they attract each other. The relative attraction of the magnets 28 is limited by the stop 34.

It is clear from FIG. 3, which shows a view from below of the pressure- and rotational-actuation device 16, that the magnets 28 assigned to the base 22 are in each case distributed substantially homogeneously over the base 22, thus equidistantly in the peripheral direction.

During a rotational actuation of the pressure- and rotational-actuation device 16, several magnets 28 or interaction elements 26 can touch the operator interface 14, whereby a corresponding actuation pattern is generated on the capacitive screen 12, which is converted into a corresponding signal by the capacitive screen 12. In particular, the contact points of the interaction elements 26 move around on the operator interface 14 during a rotational actuation, which is correspondingly detected by the capacitive screen 12.

Provided that the pressure- and rotational-actuation device 16 according to the motor vehicle operating system 10 of the first embodiment experiences a pressure actuation, all of the interaction elements 26, thus the magnets 28, which are assigned to the base 22, are simultaneously pressed onto the operator interface 14, as the actuation element 24 acts on the corresponding interaction elements 26 or magnets 28 of the second group via the stop 34. In this respect, the stop 34 or the stop ring can also be called a pressure ring, as the pressure function of the pressure- and rotational-actuation device 16 is thereby ensured, in that it transfers the compressive force to the interaction elements 26.

Provided that the operator is no longer pressing the pressure- and rotational-actuation device 16, it is returned to its neutral position due to the magnetic bias, as shown in FIG. 2.

During the pressure actuation, it can also be provided that the electrically conductive actuation element 24, thus the rotating ring, touches the operator interface 14 with its periphery, which is correspondingly detected by the capacitive screen 12.

In addition, the pressure- and rotational-actuation device 16 comprises a haptic feedback which is likewise generated via the magnets 28, in particular via the electromagnetic forces of the magnets 28, thus their reciprocal attraction or repulsion, depending on the polarity of the opposing poles of the magnets 28 of both groups.

In this respect, a haptic feedback to the operator results, which is not subject to any temperature influence. The magnets 28 of the second group also simultaneously have several functions, as they ensure the contacting (interaction with the capacitive screen 12) and the haptic feedback.

Generally, it can be provided that the interaction elements 26 have a lifting movement (in the z-direction) of approximately 1 mm, thus both during the rotational actuation and the pressure actuation of the pressure- and rotational-actuation device 16.

Figure 4:
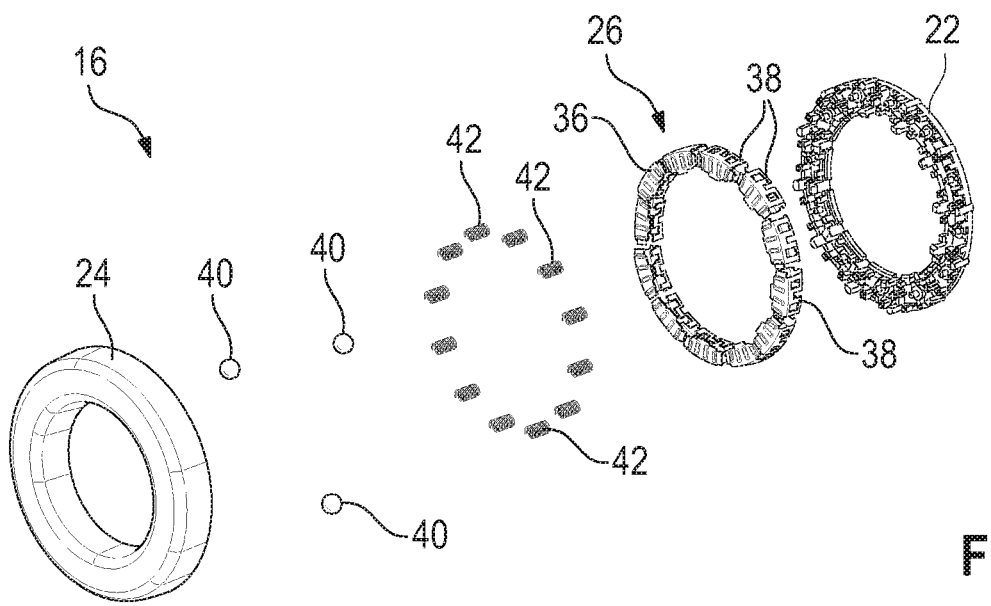
Figure 5:
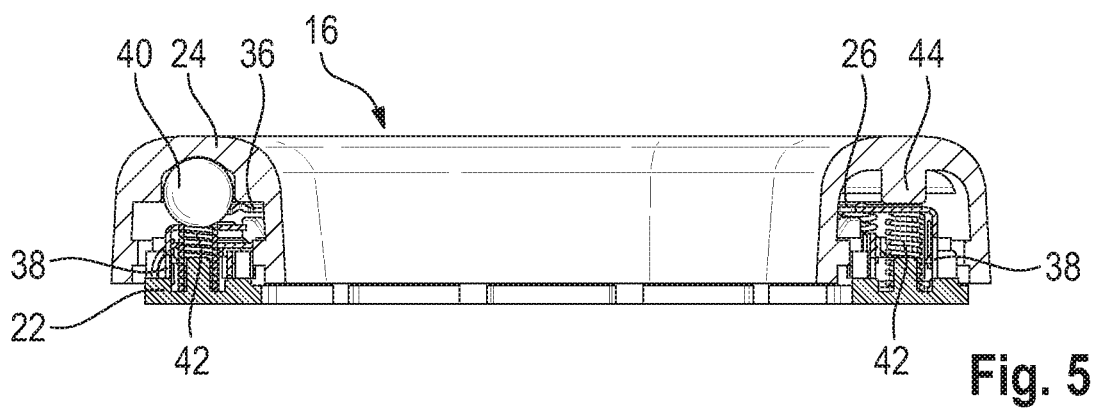
Figure 6:
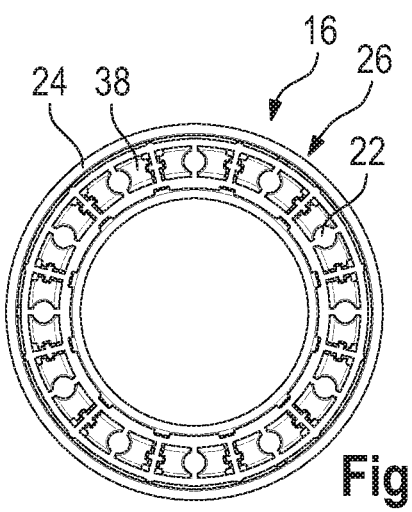

FIGS. 4 to 6 show a pressure- and rotational-actuation device 16 of a capacitive motor vehicle operating system 10 according to a second embodiment which differs from the first embodiment in that the interaction elements 26 have been replaced by a single interaction element 26.

The interaction element 26 is formed by an interaction ring 36 and comprises several sections 38 which can be actuated separately from each other, as explained below.

It is clear from the exploded view that the pressure- and rotational-actuation device 16 further comprises a base 22 which is directly affixed, in particular is glued, to the capacitive screen 12, which is not shown here for the sake of a better overview.

In addition, the pressure- and rotational-actuation device 16 further comprises an actuation element 24 which is electrically conductive, displaceable with respect to the base 22 or rotatable with respect thereto.

Moreover, in the second embodiment force transmission elements 40 are provided, which are in each case formed spherical and cooperate with the interaction element 26.

The several force transmission elements 40 ensure that, during the rotational actuation of the pressure- and rotational-actuation device 16, a movement that is as even as possible is effected.

At least one of the force transmission elements 40 is electrically conductive, with the result that an electrical connection is ensured between the electrically conductive actuation element 24 and the electrically conductive interaction element 26 via the electrically conductive force transmission element 40.

The force transmission elements 40 are coupled in a torque-proof manner to the actuation element 24 which for this purpose forms in its internal geometry, for example, a receiving space for a force transmission element 40 in which the force transmission element 40 is received. In this respect, during a rotational actuation of the actuation element 24, the force transmission elements 40 are likewise rotated with the actuation element 24.

The receiving space can be limited by stops and/or a corresponding contour can be formed in the internal geometry.

During the rotational actuation of the pressure- and rotational-actuation device 16 or of the actuation element 24, the force transmission elements 40 interact with the interaction ring 36, in particular the sections 38 of the interaction ring 36, as the force transmission elements 40 move via the interaction ring 36.

As soon as one of the force transmission elements 40 is moved via a section 38 of the interaction ring 36, the corresponding section 38 is pressed downwards onto the operator interface 14 by the corresponding force transmission element 40, viewed in the z-direction. The several force transmission elements 40 thus press the movable sections 38 of the interaction element 26 or interaction ring 36 onto the operator interface 14, whereby, at least in the case of the electrically conductive force transmission element 40, an electrical connection from the operator to the operator interface 14 is produced via the electrically conductive actuation element 24, the electrically conductive force transmission element 40 as well as the corresponding electrically conductive section 38 of the interaction element 26.

In addition, the sections 38 are each mechanically biased via a spring element 42 into a neutral position, in which the sections 38 do not contact the operator interface 14. In this respect, the at least one interaction element 26 is mechanically biased.

A tactile feedback of the pressure- and rotational-actuation device 16 is likewise provided hereby, as the force transmission elements 40 are pressed upwards in the z-direction via the spring elements 42.

Provided that the pressure- and rotational-actuation device 16 is subjected to a pressure actuation, the actuation element 24 simultaneously presses all of the sections 38 onto the operator interface 14 via an internally provided projection 44, as well as the force transmission elements 40. The projection 44 therefore cooperates with the interaction ring 36 or the interaction element 26.

The operator interface 14 is thus actuated with a corresponding contacting pattern, which is recognized by the capacitive screen 12 as pressure actuation.

The projection 44 is in particular formed such that it has a vertical travel of 1 mm in the z-direction.

In addition, the spring elements 42 ensure that the pressure- and rotational-actuation device 16 does not damage the capacitive screen 12, should too great a force be exerted during a pressure actuation, as the spring elements 42 counteract this compressive force.

Basically, in the embodiment shown, twelve sections 38 as well as twelve assigned spring elements 42 are shown, which can each be moved in the z-direction, thus in a plane perpendicular to the plane spanned by the capacitive screen 12.

Figure 7:
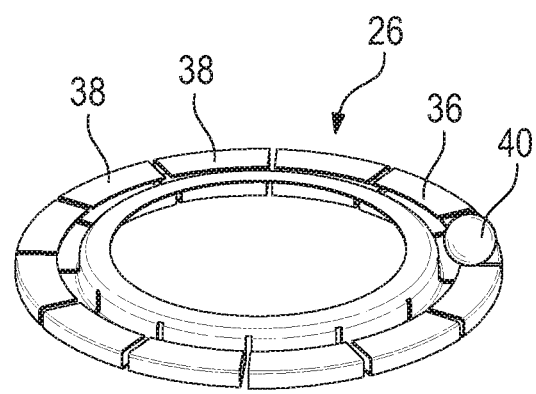

FIG. 7 shows an alternative design of the interaction ring 36 or the interaction element 26 which comprises several sections 38 which can be actuated individually and independently of each other.

The interaction ring 36 is formed from a metal sheet which is correspondingly segmented in order to provide the several sections 38 which can be displaced relative to the operator interface 14 by the at least one force transmission element 40.

The actuation of the interaction ring 36 or interaction element 26 shown in FIG. 7 is effected substantially in a manner analogous to the actuation of the interaction ring 36 or interaction element 26 shown in FIGS. 4 to 6.

Figure 8:
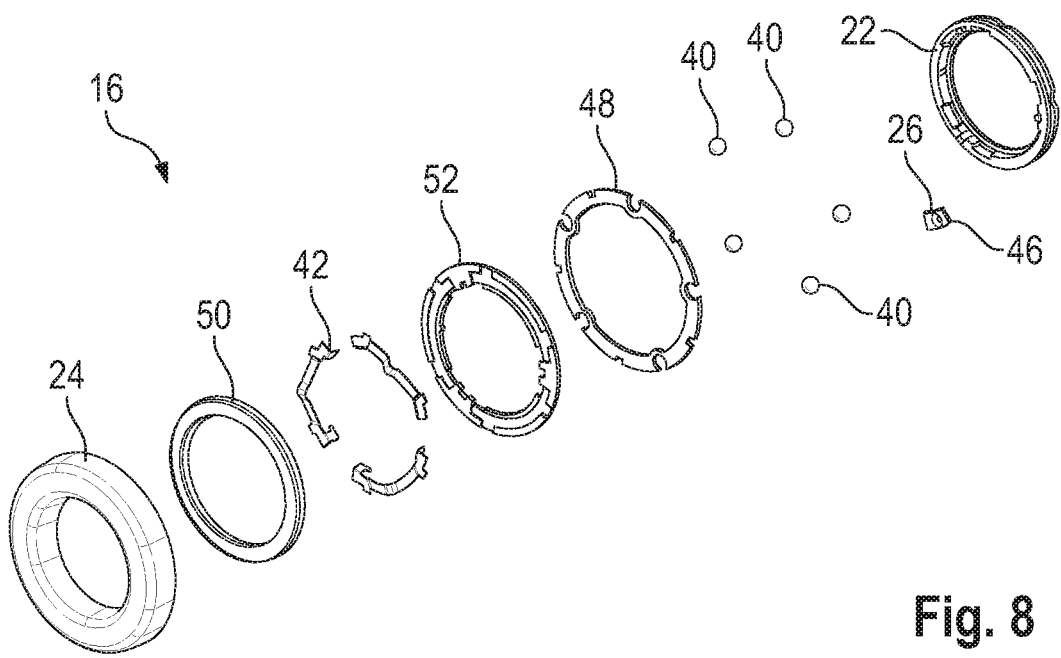
Figure 9:
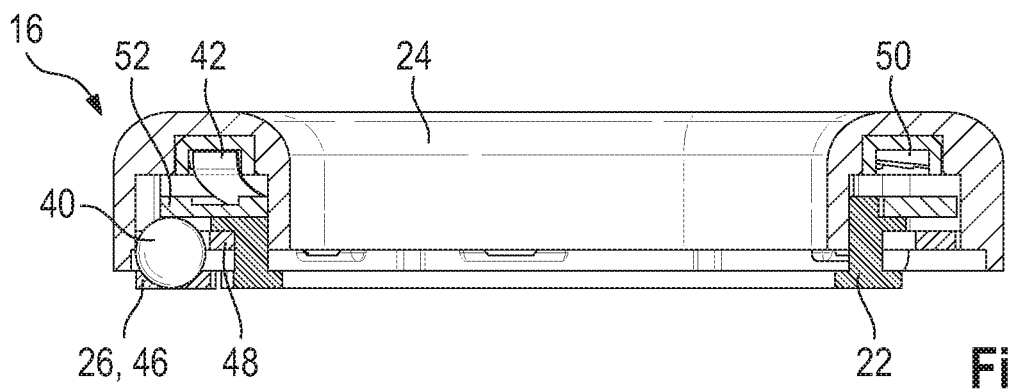
Figure 10:
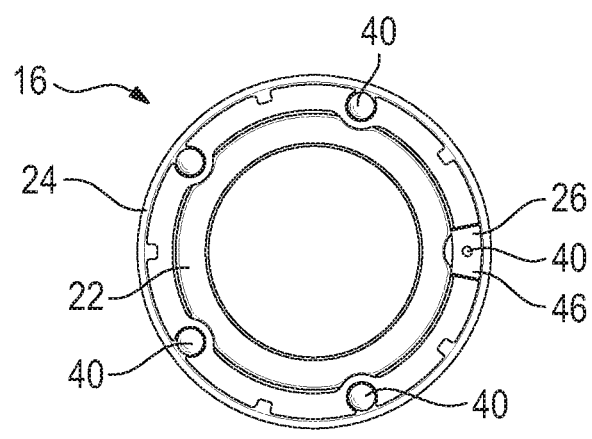

FIGS. 8 to 10 show a pressure- and rotational-actuation device 16 of a capacitive motor vehicle operating system 10 according to a third embodiment, in which five force transmission elements 40 are provided, one force transmission element 40 of which is electrically conductive.

The electrically conductive interaction element 26 is, moreover, assigned to the electrically conductive force transmission element 40 in the form of a receiver shoe 46, in which the force transmission element 40 formed as a ball is received.

In a manner analogous to the previous embodiment, the pressure- and rotational-actuation device 16 comprises a base 22 which is affixed, in particular glued, to the capacitive screen 12. An actuation element 24 that is displaceable or rotatable with respect to the base 22 is further provided, which is electrically conductive and is actuated by the operator of the motor vehicle operating system 10.

The force transmission elements 40, which are in turn all formed as balls, are received in a cage 48, with the result that the position of the force transmission elements 40 relative to each other is fixed.

Spring elements 42, via which the force transmission elements 40 and thus also the at least one electrically conductive interaction element 26, thus the receiver shoe 46, are mechanically biased, are in turn assigned to the force transmission elements 40.

Moreover, between the actuation element 24 and the spring elements 42, a tooth profile ring 50 is provided, which has a tooth profile on the sides facing towards the spring elements 42. A haptic feedback can hereby be provided during the actuation of the pressure- and rotational-actuation device 16.

The spring elements 42 are additionally held on a spring holding ring 52.

During a rotational actuation of the pressure- and rotational-actuation device 16, the rotational movement of the displaceable actuation element 24 is transferred to the cage 48 and thus to the force transmission elements 40, wherein the receiver shoe 46 or the interaction element 26 is moved via the operator interface 14.

The electrical connection is ensured via the electrically conductive actuation element 24, the at least one electrically conductive force transmission element 40 as well as the electrically conductive receiver shoe 46 or the electrically conductive interaction element 26.

The receiver shoe 46 increases the support surface area on the operator interface 14 correspondingly.

A pressure actuation of the pressure- and rotational-actuation device 16 is effected in that the actuation element 24 cooperates with the operator interface 14 over its entire periphery, whereby a correspondingly clear signal is generated by the capacitive screen 12.

The spring elements 42 are formed such that they make possible a vertical travel of approximately 1 mm in the z-direction during a pressure actuation, until they lie flat on the spring holding ring 52, thus the spring travel is used up.

As soon as the pressure actuation is no longer present, the spring elements 42 press the actuation element 24 back into its neutral position.

Figure 11:
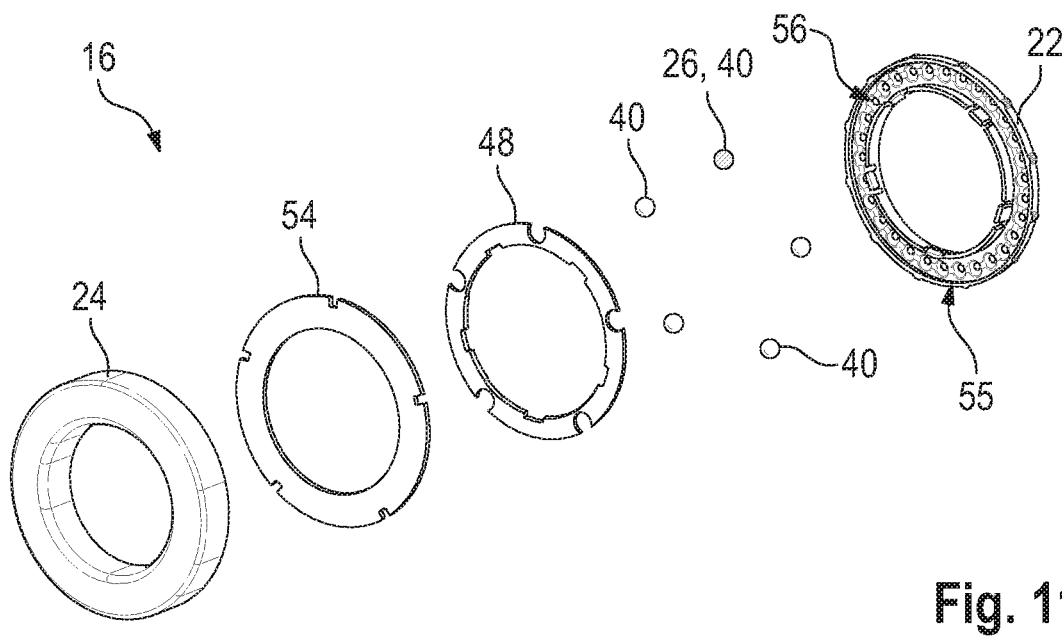
Figure 12:
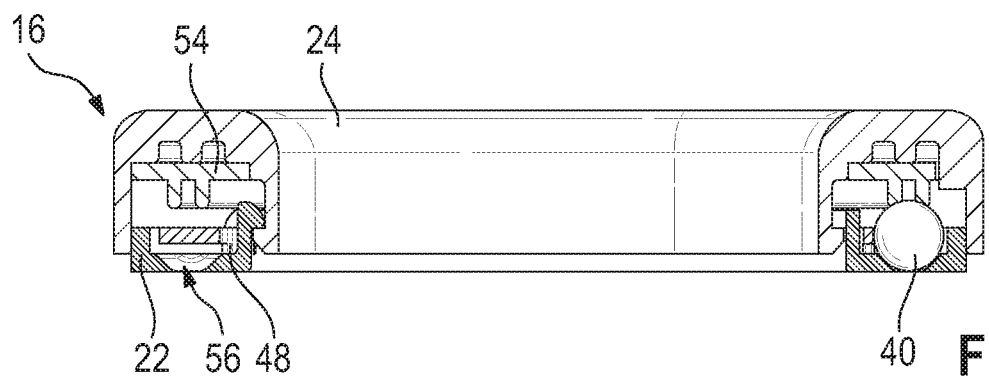
Figure 13:
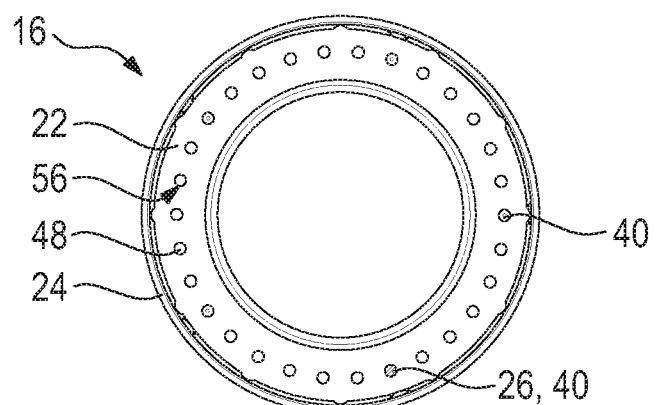

FIGS. 11 to 13 show a fourth embodiment in which, in a manner analogous to the previous embodiment, five force transmission elements 40 in the form of balls are provided.

The force transmission elements 40 are, however, formed flexible, with the result that they simultaneously provide a haptic feedback, the pressure function and a tolerance compensation.

One of the force transmission elements 40 is in turn formed electrically conductive, with the result that an electrical connection of the electrically conductive actuation element 24 to the operator interface 14 of the capacitive screen 12 can be ensured via the electrically conductive force transmission element 40.

During a rotational actuation of the pressure- and rotational-actuation device 16, the force transmission elements 40 rotate over the base 22, wherein a cage 48 is in turn provided, which holds the force transmission elements 40 in their positions.

The rotational actuation results in a rotational movement of the force transmission elements 40, wherein a substantially ring-shaped rotary carrier 54 transfers the rotation of the actuation element 24 to the force transmission elements 40 arranged in the cage 48. In the embodiment shown, the cage 48 and the rotary carrier 54 are formed separately from each other. Alternatively, however, they can also be formed coupled or even together in one piece.

The rotary carrier 54 is likewise formed electrically conductive, with the result that there is an electrical connection of the actuation element 24 to the electrically conductive force transmission element 40 or the electrically conductive interaction element 26 via the rotary carrier 54.

The base 22 in each case has recesses 56, through which at least the electrically conductive force transmission element 40 can contact the operator interface 14, with the result that the electrically conductive force transmission element 40 simultaneously represents the electrically conductive interaction element 26 which, during a rotational actuation, correspondingly moves over the operator interface 14 of the capacitive screen 12, which is detected by the capacitive screen 12.

During a pressure actuation of the pressure- and rotational-actuation device 16, the entire actuation element 24 is pressed onto the operator interface 14 of the capacitive screen 12, thus with its entire diameter, which is recognized by the capacitive screen 12 and is converted into a corresponding pressure actuation function.

In this embodiment, no separate spring elements or biasing elements are provided, as the force transmission elements 40 have an inherent mechanical bias due to their elasticity.

Via the elastic force transmission elements 40, a vertical travel of approximately 1 mm in the z-direction can be set, which has to be overcome during a pressure actuation.

The elastic force transmission elements 40 additionally return the pressure- and rotational-actuation device 16 to its neutral position, provided that a pressure actuation is no longer present.

The base 22 can further have a corresponding haptic feedback structure 55, via which a tactile feedback to the operator of the motor vehicle operating system 10 is generated when he actuates the pressure- and rotational-actuation device 16. This is due to the elastic force transmission elements 40 compressing due to the haptic feedback structure 55 of the base and then relaxing again.

Figure 14:
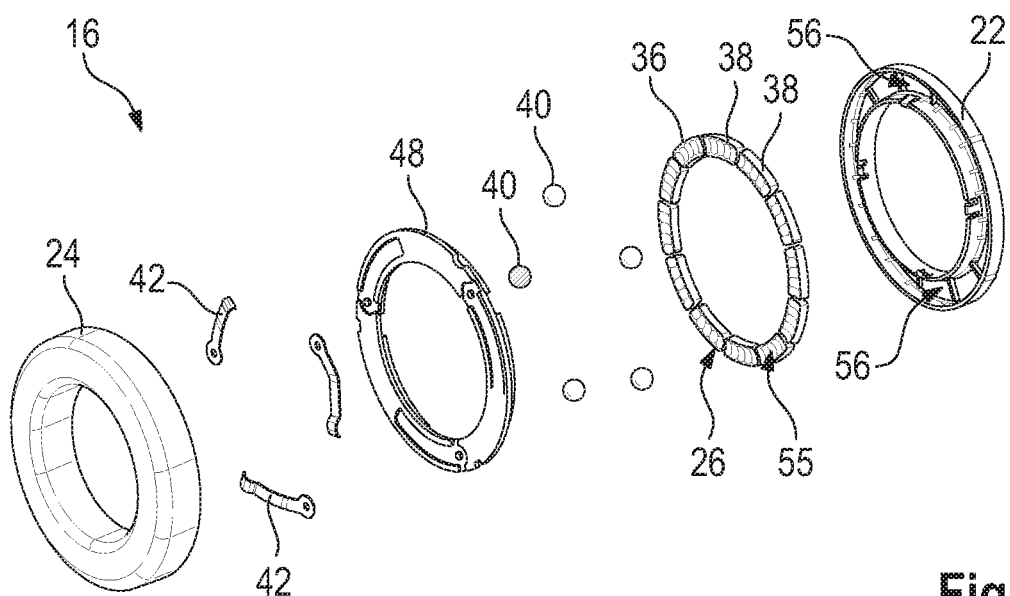
Figure 15:
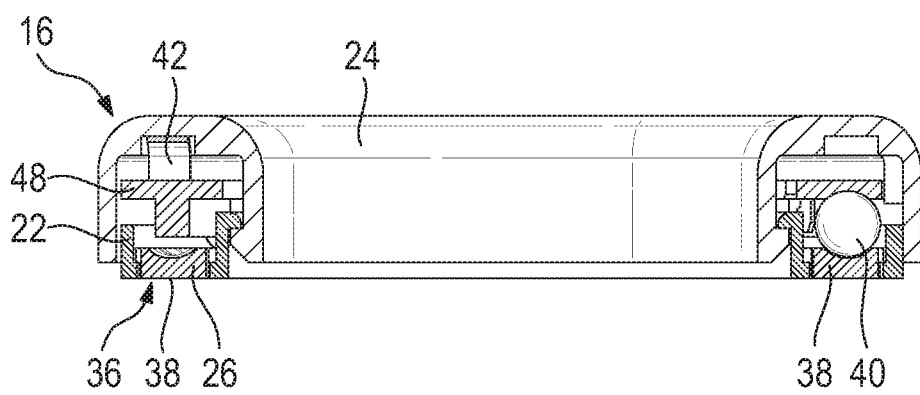
Figure 16:
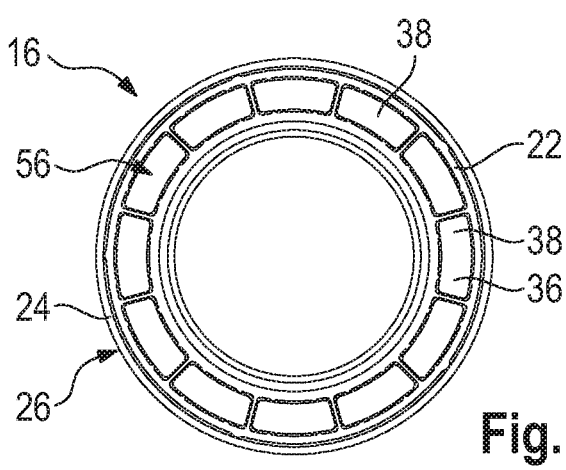

FIGS. 14 to 16 show a further embodiment of the capacitive motor vehicle operating system 10, in which the at least one interaction element 26 is in turn formed by an interaction ring 36 which comprises several electrically conductive sections 38, which can each be actuated separately and independently of each other.

The sections 38 each have a haptic feedback structure 55 which produces a tactile feedback when the pressure- and rotational-actuation device 16 is actuated by the operator, in particular when a rotational actuation is carried out, during which the force transmission elements 40 formed as balls are moved along the interaction element 26, in particular the sections 38.

It is clear from FIGS. 15 and 16 that the interaction element 26 is received in the base 22 which is not electrically conductive. For this purpose, the base 22 likewise comprises recesses 56, through which the individual sections 38 extend.

Of the several force transmission elements 40, at least one force transmission element 40 is electrically conductive, which correspondingly produces an electrical connection between the electrically conductive actuation element 24 and the electrically conductive section 38 of the interaction element 26.

During the actuation of the pressure- and rotational-actuation device 16, as already explained above, an electrical connection from the operator to the capacitive screen 12 is therefore produced via the electrically conductive actuation element 24, as well as the electrically conductive force transmission element 40 and the assigned electrically conductive section 38 of the interaction element 26, as the force transmission element 40 presses the section 38 downwards, viewed in the z-direction.

As already explained in the case of the previous embodiments, during a rotational actuation of the pressure- and rotational-actuation device 16, the force transmission elements 40 formed as balls or rolling elements roll along the interaction element 26, in particular the interaction ring 36, wherein the sections 38 rolled over by the force transmission elements 40 are pressed onto the capacitive screen 12. The electrically conductive force transmission element 40 then produces the electrical connection to the correspondingly pressed-down section 38, which is detected by the capacitive screen 12.

It is ensured via the sections 38, which can be actuated separately, that there is a relatively large actuation surface area of the electrically conductive interaction element 26 on the capacitive screen 12, with the result that the actuation can easily be detected.

In order to hold the force transmission elements 40 in position relative to each other, they are in turn received in a cage 48 which is correspondingly coupled to the actuation element 24 in a torque-proof manner.

As the sections 38 comprise a haptic feedback structure 55, a haptic feedback to the operator of the motor vehicle operating system 10 results during the rotational actuation.

Moreover, the pressure- and rotational-actuation device 16 in turn comprises spring elements 42, via which the pressure actuation of the pressure- and rotational-actuation device 16 as well as the return of the pressure- and rotational-actuation device 16 to the neutral position is ensured.

The spring elements 42 can be formed such that, during a pressure actuation, a vertical travel of approximately 1 mm of the pressure- and rotational-actuation device 16 in the z-direction in turn results.

During a pressure actuation of the pressure- and rotational-actuation device 16, the entire actuation element 24, thus the rotating ring, is pressed onto the capacitive operator interface 14 of the capacitive screen 12, with the result that its outer periphery is supported flat.

A corresponding signal is hereby generated by the capacitive screen 12.

Generally, the force transmission elements 40 can be formed elastic, whereby damage to the capacitive screen 12 can be prevented when too great a pressure actuation is performed.

Figure 17:
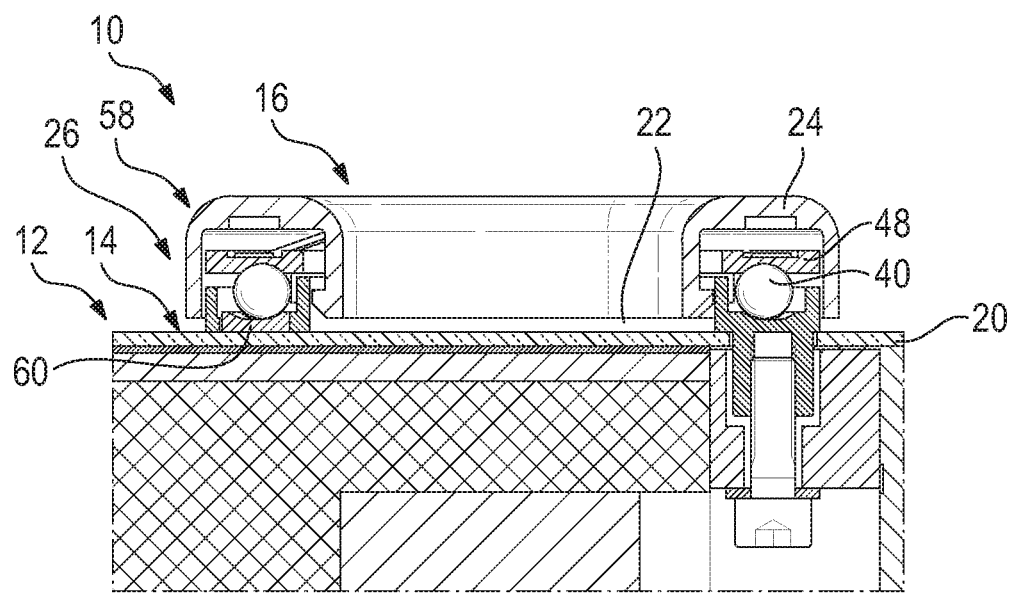
Figure 18:
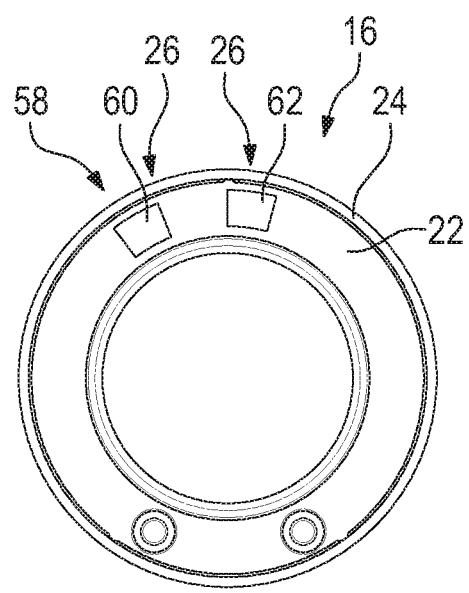
Figure 19:
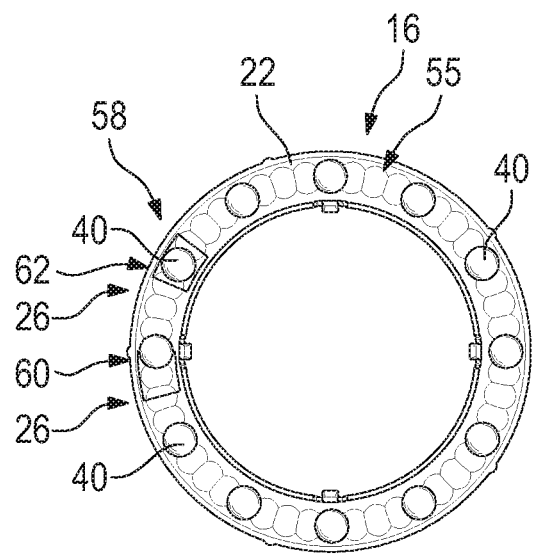

FIGS. 17 to 19 show a further embodiment of a capacitive motor vehicle operating system 10 which comprises a rotary encoder 58.

The rotary encoder 58 can generally detect the rotational angle of the pressure- and rotational-actuation device 16 occurring during a rotational actuation.

In the embodiment shown, the rotary encoder 58 is formed capacitive, as the pressure- and rotational-actuation device 16 has two detection areas 60, 62 separated from each other, which are spaced apart from each other by a defined distance, as can be seen in particular in FIG. 18.

The detection areas 60, 62 are formed electrically conductive and therefore form the electrically conductive interaction elements 26 which interact with the capacitive screen 12.

The pressure- and rotational-actuation device 16 likewise has several force transmission elements 40 which, during a rotational actuation of the pressure- and rotational-actuation device 16, are displaced relative to the base 22 by the displaceable actuation element 24, wherein—depending on the rotational angle—they interact with the detection areas 60, 62, with the result that they produce an electrical connection to the operator interface 14 via the corresponding detection area 60, 62.

The force transmission elements 40 are therefore formed electrically conductive, wherein they are held in position relative to each other via a cage 48, thus viewed in the peripheral direction. The cage 48 therefore ensures that the force transmission elements 40 are in each case equidistant from each other.

Due to the distance of the force transmission elements 40 from each other, as well as the distance of the detection areas 60, 62 from each other, it can be determined during a rotational actuation of the pressure- and rotational-actuation device 16 via the two detection areas 60, 62, or the two interaction elements 26, by what angle and in what direction the pressure- and rotational-actuation device 16 is rotated.

For this, the time resolution of the electrical connections of the two detection areas 60, 62 or the two interaction elements 26 is taken into account.

The rotational angle can correspondingly be determined via the number of the actuation of the respective detection areas 60, 62.

During a pressure actuation of the pressure- and rotational-actuation device 16, the entire actuation element 24 is in turn pressed onto the operator interface 14 via its (outer) diameter, which is correspondingly detected by the capacitive screen 12.

As is clear from FIG. 17, among others, the pressure- and rotational-actuation device 16 formed separately from the capacitive screen 12 can generally also be affixed to the capacitive screen 12 via a mechanical connection such as a screw connection or similar, in particular in addition to an adhesive bond, thus gluing.

Figure 20:
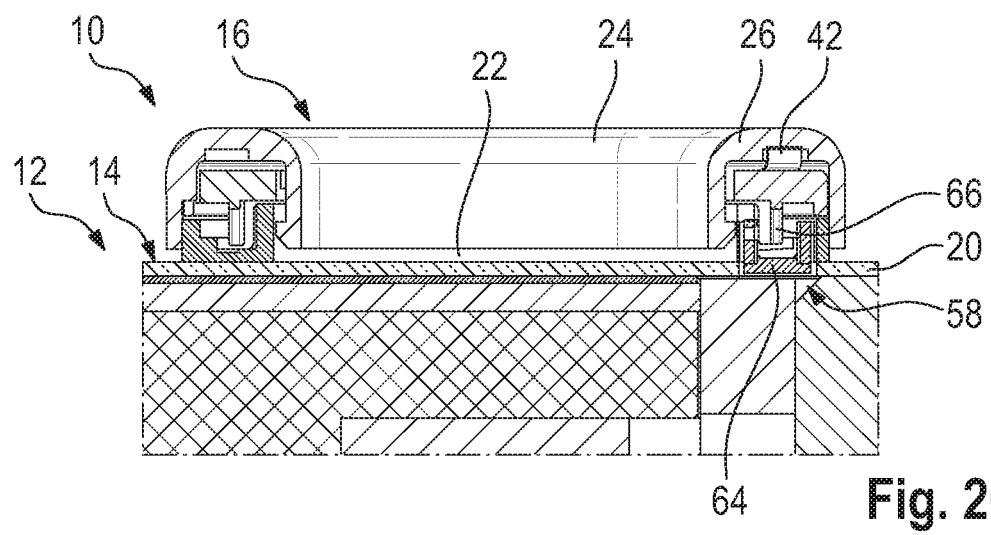
Figure 21:
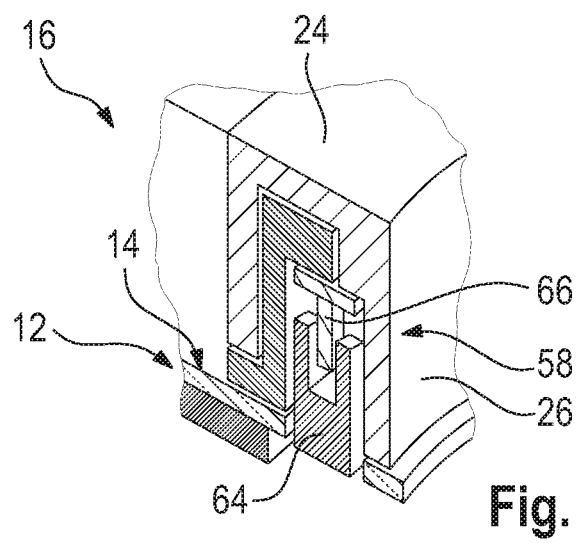
Figure 22:
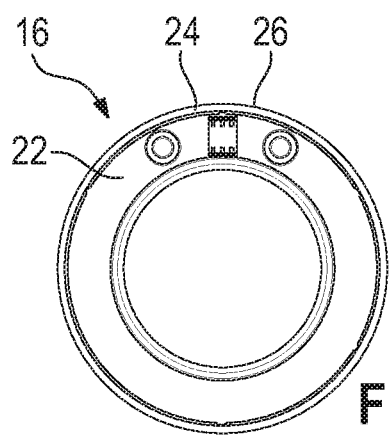
Figure 23:
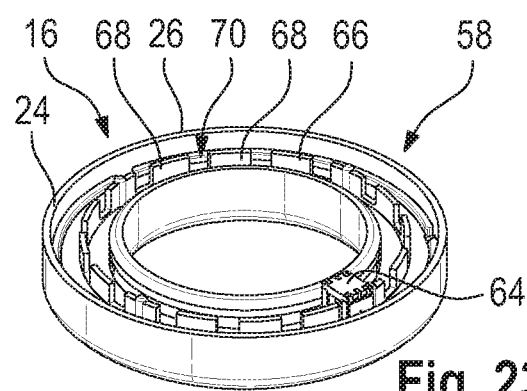

FIGS. 20 to 22 show a further embodiment in which the rotary encoder 58 comprises an optical sensor 64, thus detects the rotational angle in an optical manner. The optical sensor 64 comprises at least one light transmitter as well as one light receiver.

Moreover, the rotary encoder 58 has a coding ring 66 which is assigned to the displaceable actuation element 24, for example is coupled to the actuation element 24 in a torque-proof manner, with the result that when the actuation element 24 is rotated, the coding ring 66 is rotated with it.

The coding ring 66 comprises several sections 68 which are separated from each other by recesses 70. A light beam emitted by the optical sensor 64 can pass through the recesses 70, which is in turn detected by the optical sensor 64.

In this respect the light transmitter and the light receiver are assigned to opposite sides of the coding ring 66.

During a rotational actuation of the pressure- and rotational-actuation device 16, the optical sensor 64 therefore detects the optical changes occurring due to the coding ring 66, in order to infer the corresponding rotational angle during the rotational actuation.

The optical changes are caused by the light from the transmitter of the optical sensor 64 passing through one of the recesses 70 and being able to be received by the receiver of the optical sensor 64, or by being blocked by one of the sections 68.

Provided that the optical sensor 64 operates with two light beams, for example with two light transmitters and two light receivers, the rotational direction during the rotational actuation of the pressure- and rotational-actuation device 16 can moreover be recognized.

As is clear from FIGS. 20 and 21, the optical sensor 64 is assigned to the glass plate 20 of the capacitive screen 12, in particular partially received in the glass plate 20. For this, the glass plate 20 is at least partially perforated.

The pressure actuation of the pressure- and rotational-actuation device 16 is effected in a known manner, in that spring elements 42 are compressed until the electrically conductive actuation element 24 comes into contact with the capacitive screen 12, in particular the operator interface 14, which is correspondingly detected by the capacitive screen 12. In this respect, the actuation element 24 represents the interaction element 26 which interacts with the capacitive screen 12.

The spring elements 42 provide the haptic feedback and further ensure that the actuation element 24 returns to its neutral position.

Figure 24:
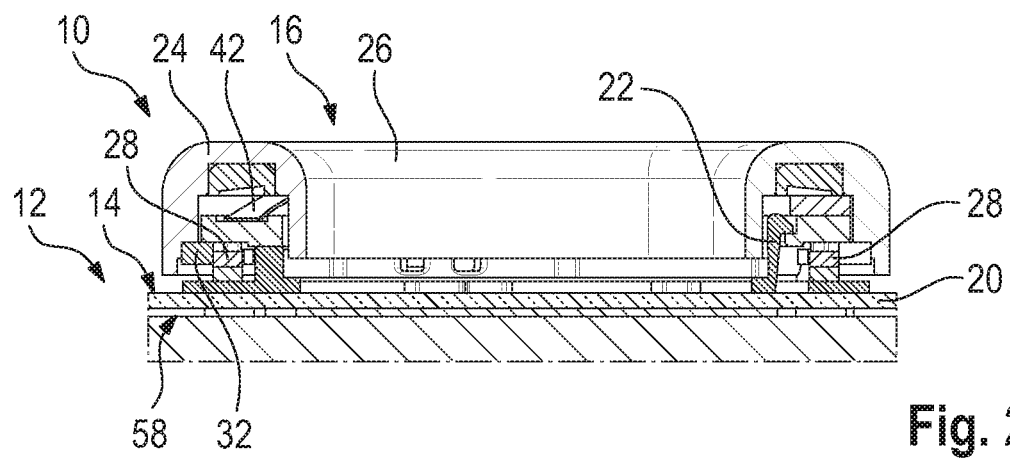
Figure 25:
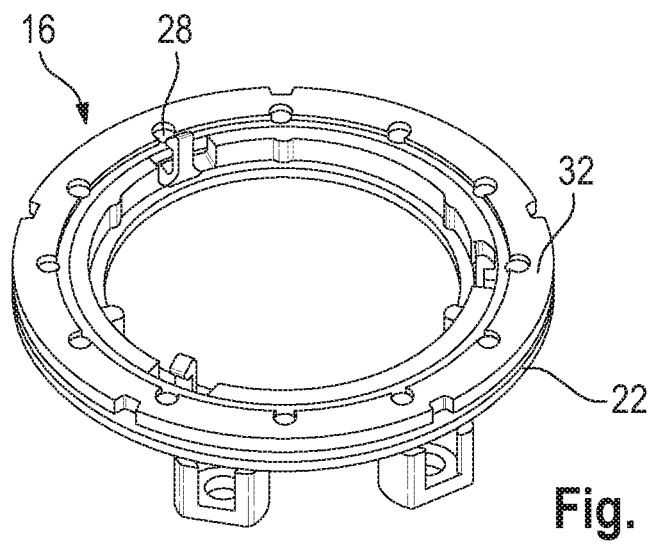
Figure 26:
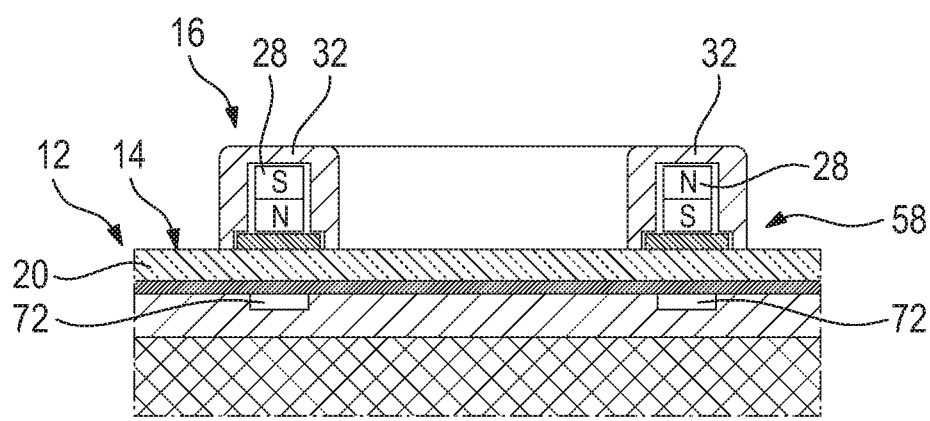

FIGS. 24 to 26 show a further embodiment in which the rotary encoder 58 comprises at least one Hall effect sensor 72 which interacts with magnets 28 which are assigned to the actuation element 24.

The magnets 28 can be arranged in a guide element 32, which can also be called a guide ring. The guide element 32 can in turn be coupled to the actuation element 24 in a torque-proof manner, with the result that, during a rotational actuation, the magnets 28 move over the operator interface 14 and thus also over the Hall effect sensors 72.

When the pressure- and rotational-actuation device 16 is rotated, the magnets 28 bring about a change in magnetic flux which is detected by the Hall effect sensor 72.

For this, the magnets 28 are in particular assigned to the operator interface 14 with alternating polarity.

The Hall effect sensors 72 can be arranged underneath the glass plate 20 of the capacitive screen 12, for example underneath the capacitive sensor layer of the capacitive screen 12.

The magnets 28 can represent the interaction elements 26, as has already been explained above with reference to FIGS. 2 and 3.

Alternatively, the actuation element 24 can represent the interaction element 26, provided that a pressure actuation is performed, as has already been described above.

The spring elements 42 can in turn serve for the haptic feedback and provide a vertical travel in the z-direction of approximately 1 mm.

Figure 27:
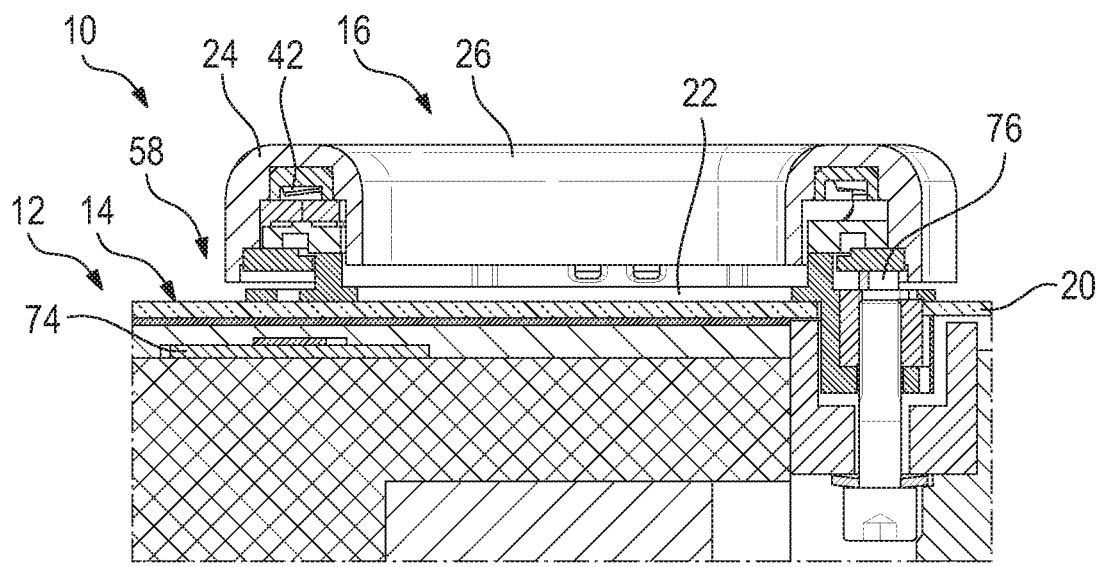
Figure 28:
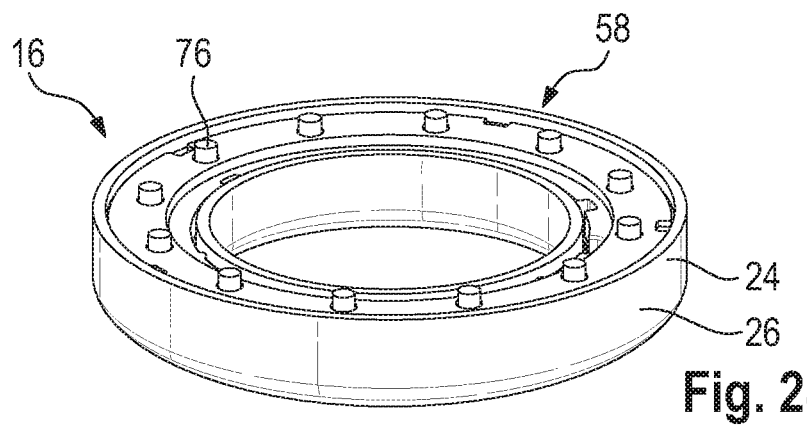
Figure 29:
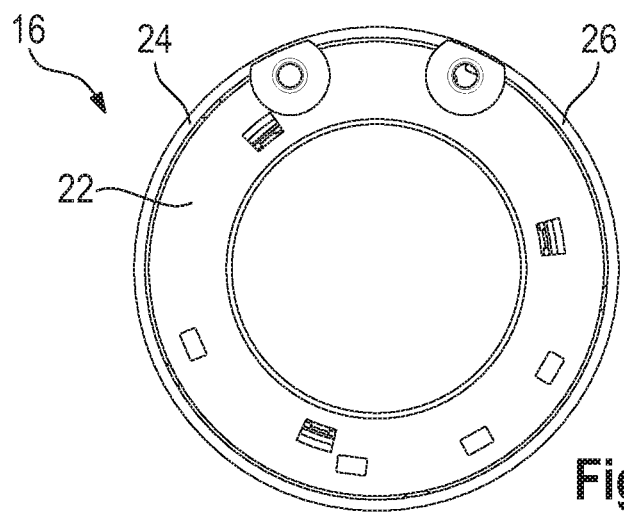

FIGS. 27 to 29 show a further embodiment in which the rotary encoder 58 comprises at least one inductive coil 74, which is formed for example via an FPC cable.

The FPC cable is likewise arranged underneath the glass plate 20 of the capacitive screen 12, wherein a change in inductance is detected by the at least one inductive coil 74, in order to detect a rotation of the pressure- and rotational-actuation device 16.

For this, an induction material 76 such as a piece of iron is assigned to the actuation element 24, which is correspondingly detected by the at least one inductive coil 74 when the actuation element 24 is rotated, thus is subjected to a rotational actuation.

Provided that two inductive coils 74 are provided, the rotational direction of the pressure- and rotational-actuation device 16 can thus also be detected.

The pressure actuation can again be effected against the spring force of the spring elements 42, with the result that the actuation element 24 serves as the interaction element 26, as the electrically conductive actuation element 24 interacts with the capacitive screen 12.

The invention claimed is:

1. A capacitive motor vehicle operating system, comprising:
a pressure- and rotational-actuation device and a capacitive screen with an operator interface, the pressure- and rotational-actuation device being formed separately from the capacitive screen, the pressure- and rotational-actuation device being electrically conductive in areas, the pressure- and rotational-actuation device being at least partially affixed to the operator interface of the capacitive screen, the pressure- and rotational-actuation device including at least one electrically conductive interaction element which interacts with the capacitive screen,
wherein a pressure actuation is effected substantially parallel to a rotational axis towards the capacitive screen,
wherein, during actuation of the pressure- and rotational-actuation device, there is an electrical connection between the operator interface of the capacitive screen and a rotatable actuation element of the pressure- and rotational actuation device,
wherein the electrical connection is provided via the at least one electrically conductive interaction element which contacts the operator interface during pressure actuation and rotational actuation,
wherein the capacitive screen detects the pressure actuation,
wherein the entire pressure- and rotational-actuation device is laterally immobile in a plane spanned by the screen,
wherein the pressure- and rotational-actuation device comprises a stationary base via which the pressure- and rotational-actuation is affixed to the capacitive screen, and
wherein during a pressure actuation, the relative change in position of the at least one electrically conductive interaction element to the base is effected in a plane perpendicular to the operator interface of the capacitive screen.

2. The capacitive motor vehicle operating system according to claim 1, wherein the interaction element comprises at least one of several interaction elements and several interaction element sections, via which the rotational angle of the pressure- and rotational-actuation device can be detected, wherein the at least one of several interaction elements and several interaction element sections can be actuated separately from each other and via which the rotational angle of the pressure- and rotational-actuation device can be detected, wherein the at least one of several interaction elements and several interaction element sections each comprise a haptic feedback structure.

3. The capacitive motor vehicle operating system according to claim 1, wherein the pressure- and rotational-actuation device has at least one force transmission element which cooperates with the interaction element.

4. The capacitive motor vehicle operating system according to claim 1, wherein, during actuation of the pressure- and rotational-actuation device, the at least one interaction element experiences a change in position relative to the operator interface of the capacitive screen.

5. The capacitive motor vehicle operating system according to claim 1, wherein the at least one interaction element is formed by at least one magnet.

6. The capacitive motor vehicle operating system according to claim 1, wherein the at least one interaction element is at least one of elastic, mechanically biased, and electromagnetically biased.

7. The capacitive motor vehicle operating system according to claim 1, wherein the motor vehicle operating system comprises a rotary encoder, via which the rotational angle of the pressure- and rotational-actuation device during a rotational actuation can be detected.

8. The capacitive motor vehicle operating system according to claim 7, wherein the rotary encoder comprises at least one of an optical sensor, a Hall effect sensor, and an inductive coil.

9. The capacitive motor vehicle operating system according to claim 1, wherein the capacitive screen has at least one display area which is assigned to the pressure- and rotational-actuation device and, during actuation of the pressure- and rotational-actuation device, outputs an optical feedback.

10. The capacitive motor vehicle operating system according to claim 1, wherein the pressure- and rotational-actuation device is formed ring-shaped, wherein the pressure- and rotational-actuation device comprises a stationary base and an actuation element displaceable with respect to the base.

11. The capacitive motor vehicle operating system according to claim 1, wherein the motor vehicle operating system is formed to detect pressure actuation of the pressure- and rotational-actuation device by means of the capacitive screen in a capacitive manner.

12. A capacitive motor vehicle operating system, comprising:
a pressure- and rotational-actuation device and a capacitive screen with an operator interface, the pressure- and rotational-actuation device being formed separately from the capacitive screen, the pressure- and rotational-actuation device being electrically conductive in areas, the pressure- and rotational-actuation device being at least partially affixed to the operator interface of the capacitive screen, the pressure- and rotational-actuation device including at least one electrically conductive interaction element which interacts with the capacitive screen,
wherein the pressure- and rotational-actuation device is ring-shaped,
wherein the capacitive screen has at least one display area which is assigned to the pressure- and rotational-actuation device and, during actuation of the pressure- and rotational-actuation device, outputs an optical feedback,
wherein the at least one display area is provided within the ring-shaped pressure- and rotational-actuation device,
wherein the at least one display area is exposed and accessible for input within the pressure- and rotational-actuation device,
where the entire pressure- and rotational-actuation device is laterally immobile in a plane spanned by the screen,
wherein the pressure- and rotational-actuation device comprises a stationary base via which the pressure- and rotational-actuation is affixed to the capacitive screen, and
wherein during a pressure actuation, the relative change in position of the at least one electrically conductive interaction element to the base is effected in a plane perpendicular to the operator interface of the capacitive screen.

13. The capacitive motor vehicle operating system according to claim 12, wherein a pressure actuation is effected substantially parallel to a rotational axis in the direction of the capacitive screen and is detected by means of the capacitive screen in a capacitive manner, wherein, during actuation of the pressure- and rotational-actuation device, there is an electrical connection between the operator interface of the capacitive screen and a rotatable actuation element of the pressure- and rotational-actuation device, and wherein the electrical connection is provided via the at least one electrically conductive interaction element which contacts the operator interface during actuation.

14. A capacitive motor vehicle operating system comprising:
a pressure- and rotational-actuation device and a capacitive screen with an operator interface, the pressure- and rotational-actuation device being formed separately from the capacitive screen, the pressure- and rotational-actuation device being electrically conductive in areas, the pressure- and rotational-actuation device being at least partially affixed to the operator interface of the capacitive screen, the pressure- and rotational-actuation device comprising at least one electrically conductive interaction element which interacts with the capacitive screen,
wherein a pressure actuation is effected substantially parallel to a rotational axis towards the capacitive screen,
wherein, during actuation of the pressure- and rotational-actuation device, there is an electrical connection between the operator interface of the capacitive screen and rotatable actuation element of the pressure- and rotational-actuation device,
wherein the electrical connection is provided via the at least one electrically conductive interaction element which contacts the operator interface during actuation,
wherein the motor vehicle operating system being configured to detect at least one pressure actuation of the pressure- and rotational-actuation device by means of the capacitive screen in a capacitive manner,
wherein the entire pressure- and rotational-actuation device being laterally immobile in a plane spanned by the screen,
wherein the pressure- and rotational-actuation device comprises a stationary base via which the pressure- and rotational-actuation is affixed to the capacitive screen,
wherein during a rotation actuation and during a pressure actuation, the actuation element is moved relative to the stationary base, and
wherein, during a pressure actuation, the relative change in position of the at least one electrically conductive interaction element to the base is effected in a plane perpendicular to the operator interface of the capacitive screen.

* * * * *